United States Patent
Konnoth Joseph et al.

(10) Patent No.: US 11,610,800 B2
(45) Date of Patent: Mar. 21, 2023

(54) CAPACITIVE METHOD OF DETECTING WAFER CHUCKING AND DE-CHUCKING

(71) Applicant: Applied Materials, Inc., Santa Clara, CA (US)

(72) Inventors: Job George Konnoth Joseph, Kerala (IN); Syam Sundeep Boosa, Bangalore (IN); Gopu Krishna, Bangalore (IN); Rupankar Choudhury, Agartala (IN)

(73) Assignee: Applied Materials, Inc., Santa Clara, CA (US)

( * ) Notice: Subject to any disclaimer, the term of this patent is extended or adjusted under 35 U.S.C. 154(b) by 72 days.

(21) Appl. No.: 17/208,441

(22) Filed: Mar. 22, 2021

(65) Prior Publication Data

US 2022/0301915 A1   Sep. 22, 2022

(51) Int. Cl.
*H01T 23/00* (2006.01)
*H01L 21/683* (2006.01)
*H01L 21/66* (2006.01)
*H01L 21/67* (2006.01)

(52) U.S. Cl.
CPC .... *H01L 21/6833* (2013.01); *H01L 21/67103* (2013.01); *H01L 22/14* (2013.01); *H01L 22/34* (2013.01)

(58) Field of Classification Search
None
See application file for complete search history.

(56) References Cited

U.S. PATENT DOCUMENTS

| | | | |
|---|---|---|---|
| 6,075,375 A | 6/2000 | Burkhart et al. | |
| 2003/0033116 A1 | 2/2003 | Brcka et al. | |
| 2010/0156449 A1* | 6/2010 | Nitta | G01R 31/2875 324/756.03 |
| 2014/0002805 A1* | 1/2014 | Banine | G03F 7/70708 355/72 |
| 2015/0138687 A1 | 5/2015 | Boyd, Jr. et al. | |
| 2017/0162415 A1 | 6/2017 | Uehara et al. | |

FOREIGN PATENT DOCUMENTS

JP    2016063005 A    4/2016

OTHER PUBLICATIONS

Application No. PCT/US2022/020567, International Search Report and the Written Opinion, dated Jul. 6, 2022, 11 pages.

* cited by examiner

*Primary Examiner* — Stephen W Jackson
(74) *Attorney, Agent, or Firm* — Kilpatrick Townsend & Stockton LLP (57) ABSTRACT

Exemplary support assemblies may include an electrostatic chuck body defining a support surface that defines a substrate seat. The assemblies may include a support stem coupled with the chuck body. The assemblies may include a heater embedded within the chuck body. The assemblies may include a first bipolar electrode embedded within the electrostatic chuck body between the heater and support surface. The assemblies may include a second bipolar electrode embedded within the chuck body between the heater and support surface. The assemblies may include at least one inner capacitive sensor embedded within the electrostatic chuck body at a position proximate a center of the substrate seat. The assemblies may include at least one outer capacitive sensor embedded within the electrostatic chuck body at a position proximate a peripheral edge of the substrate seat.

20 Claims, 6 Drawing Sheets

CAPACITIVE METHOD OF DETECTING WAFER CHUCKING AND DE-CHUCKING

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing.

Internally located heating devices may generate heat within the support, and the heat may be transferred conductively to the substrate. The substrate support may also be utilized in some technologies to develop a substrate-level plasma, as well as to chuck the substrate to the support electrostatically. Plasma generated near the substrate may cause bombardment of components, as well as parasitic plasma formation in unfavorable regions of the chamber. The conditions may also lead to discharge between substrate support electrodes. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary substrate support assemblies may include an electrostatic chuck body defining a support surface that defines a substrate seat. The substrate support assemblies may include a support stem coupled with the chuck body. The substrate support assemblies may include a heater embedded within the chuck body. The substrate support assemblies may include a first bipolar electrode embedded within the electrostatic chuck body between the heater and support surface. The substrate support assemblies may include a second bipolar electrode embedded within the chuck body between the heater and support surface. The substrate support assemblies may include at least one inner capacitive sensor embedded within the electrostatic chuck body at a position proximate a center of the substrate seat. The substrate support assemblies may include at least one outer capacitive sensor embedded within the electrostatic chuck body at a position proximate a peripheral edge of the substrate seat.

In some embodiments, each of the at least one inner capacitive sensor and the at least one outer capacitive sensor may be disposed between a surface of the substrate seat and a top surface of one or both of the first bipolar electrode and the second bipolar electrode. Each of the at least one inner capacitive sensor and the at least one outer capacitive sensor may include a negative electrode and a positive electrode. The at least one outer capacitive sensor may include a plurality of outer capacitive sensors disposed about the peripheral edge of the substrate seat. At least two of the plurality of outer capacitive sensors may be disposed at equal radial distances from a center of the substrate seat. The plurality of outer capacitive sensors may be disposed at equal angular intervals about the peripheral edge of the substrate seat. The substrate support assemblies may include an AC voltage supply coupled with each of the at least one inner capacitive sensor and the at least one outer capacitive sensor.

Some embodiments of the present technology may also encompass substrate support assemblies that include a chuck body defining a substrate support surface that defines a substrate seat. The substrate support assemblies may include a support stem coupled with the chuck body. The substrate support assemblies may include a heater embedded within the chuck body. The substrate support assemblies may include a chucking mechanism disposed within the chuck body between the heater and the substrate support surface. The substrate support assemblies may include at least one inner capacitive sensor embedded within the chuck body at a position proximate a center of the substrate seat. The substrate support assemblies may include a plurality of outer capacitive sensors embedded within the chuck body at positions proximate a peripheral edge of the substrate seat.

In some embodiments, at least two of the plurality of outer capacitive sensors may be spaced at equal radial distances from a center of the substrate seat. The substrate support assemblies may include an AC voltage supply coupled with each of the at least one inner capacitive sensor and the plurality of outer capacitive sensors. The plurality of outer capacitive sensors may be disposed at equal angular intervals about the peripheral edge of the substrate seat. Each of the at least one inner capacitive sensor and the plurality of outer capacitive sensors may be disposed between a surface of the substrate seat and a top surface of the heater. The chucking mechanism may include a bipolar electrostatic chuck, a monopolar electrostatic chuck, or a vacuum chuck.

Some embodiments of the present technology may also encompass methods of determining whether a wafer is fully chucked. The methods may include supplying a voltage to a plurality of capacitive sensors embedded within a chuck body. The chuck body may define a substrate support surface that defines a substrate seat. At least one of the plurality of capacitive sensors may be positioned proximate a center of the substrate seat. At least one of the plurality of capacitive sensors may be positioned proximate a peripheral edge of the substrate seat. The methods may include measuring a capacitance at each of the plurality of capacitive sensors. The methods may include determining whether a wafer positioned atop the substrate seat is disposed flat against the substrate seat based at least in part on the capacitance of each of the plurality of capacitive sensors.

In some embodiments, determining whether the wafer positioned atop the substrate seat is disposed flat against the substrate seat may include comparing each capacitance to a baseline value. Determining whether the wafer positioned atop the substrate seat is disposed flat against the substrate seat may include comparing the capacitance of each of the plurality of capacitive sensors to the capacitance of at least one other of the plurality of capacitive sensors. Determining whether the wafer positioned atop the substrate seat is disposed flat against the substrate seat may include determining an average capacitance of the plurality of capacitive sensors and comparing the capacitance of each of the plurality of capacitive sensors to the average capacitance. The methods may include determining one or both of a type of bowing of the wafer and a magnitude of bowing of the wafer based on the capacitance of each of the plurality of capacitive sensors. The methods may include adjusting a chucking force based on the capacitance of each of the plurality of capacitive sensors. Adjusting the chucking force may include increasing a chucking voltage to reduce a gap between the wafer and the substrate seat.

Such technology may provide numerous benefits over conventional systems and techniques. For example, embodiments of the present technology may provide substrate supports that may detect whether wafers are chucked or de-chucked. Embodiments may also enable a chucked and/or bowed state of the wafer to be determined in situ, which may enable a chucking force to be adjusted to counteract any undesirable conditions. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. These formed films may be produced under conditions that cause stresses on the substrate. A chuck, such as an electrostatic chuck, may be used to produce a clamping action against the substrate to overcome the bowing stress.

However, as semiconductor processing continues to increase precision and reduce device sizes, chucking may participate in issues with processing. In some instances, it may not be known whether a substrate is de-chucked after processing, even when a chucking voltage is no longer being supplied to the substrate. This may be due to residual electrostatic charges that remain, for example, between a bottom surface of the substrate an the chuck body. These residual charges may be created by plasma that becomes trapped beneath the substrate and therefore are not dissipated during processing operations. In such instances, when an attempt is made to move the clamped substrate, such as using lift pins, the substrate may break or otherwise become damaged.

Additionally, during processing it may be difficult to determine whether a given chucking force is sufficient to overcome any bowing stress, which may change over time as greater thicknesses of film build up on the substrate. If the chucking force is too low, the bowing stress may cause the substrate to bow, which may cause film uniformity issues on the substrate.

The present technology overcomes these challenges with substrate support assemblies that include a number of capacitive sensors that may be used to determine whether the substrate is fully clamped and/or whether any bowing or other gaps are present. Additionally, the present technology may implement in situ capacitive sensing, which may enable mitigating actions (such as the adjustment of chucking force) to be made to account for present substrate conditions.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

Figure 1:
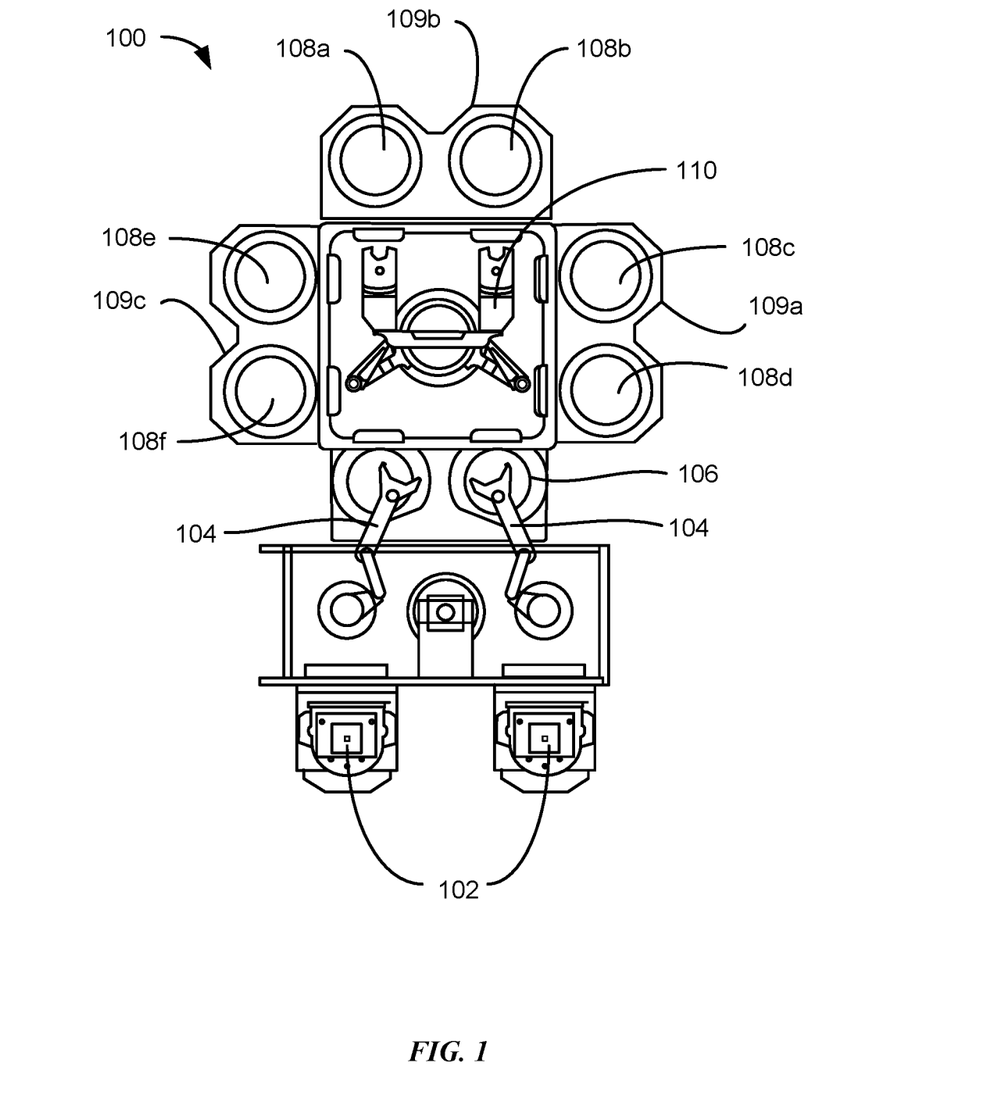
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
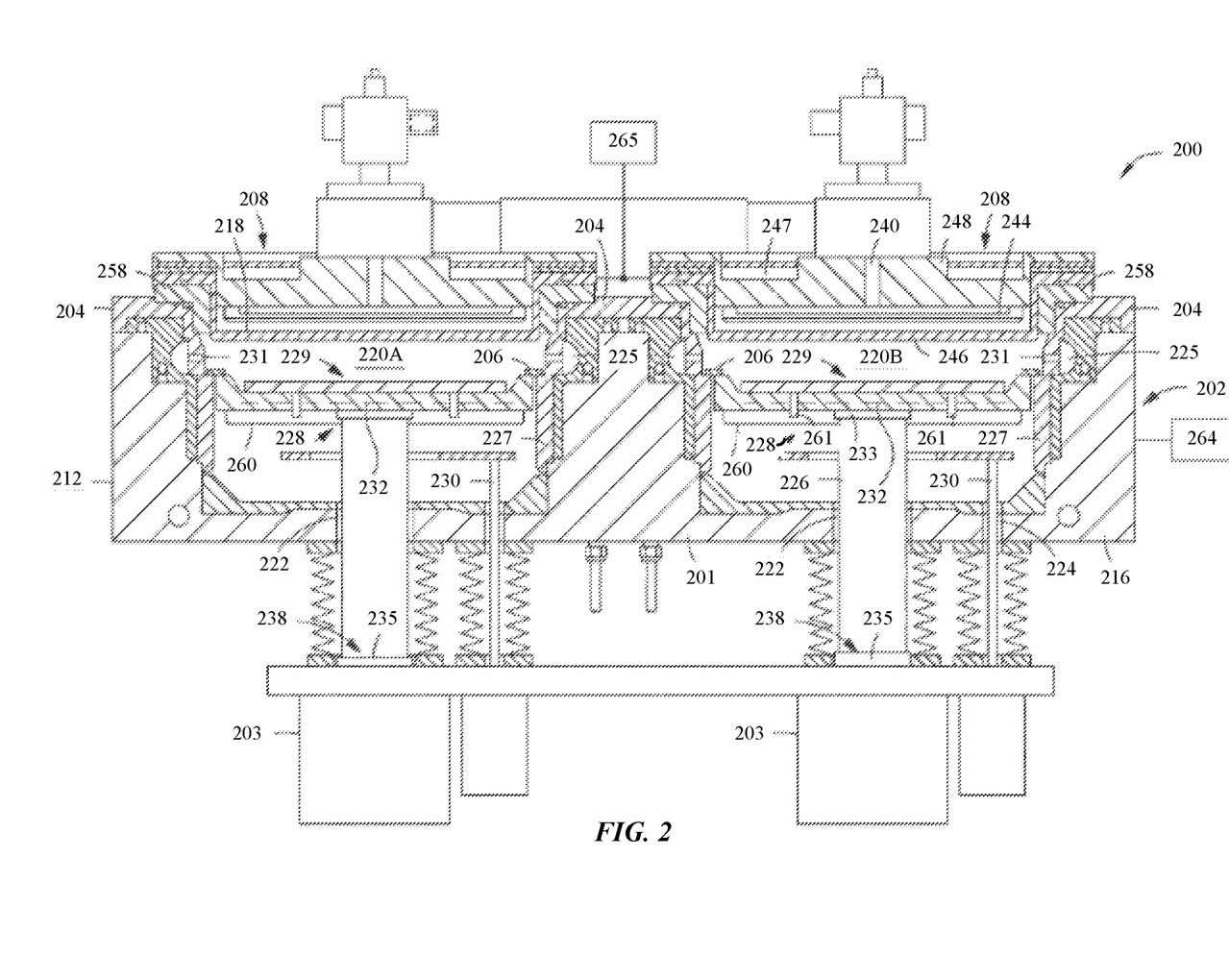
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
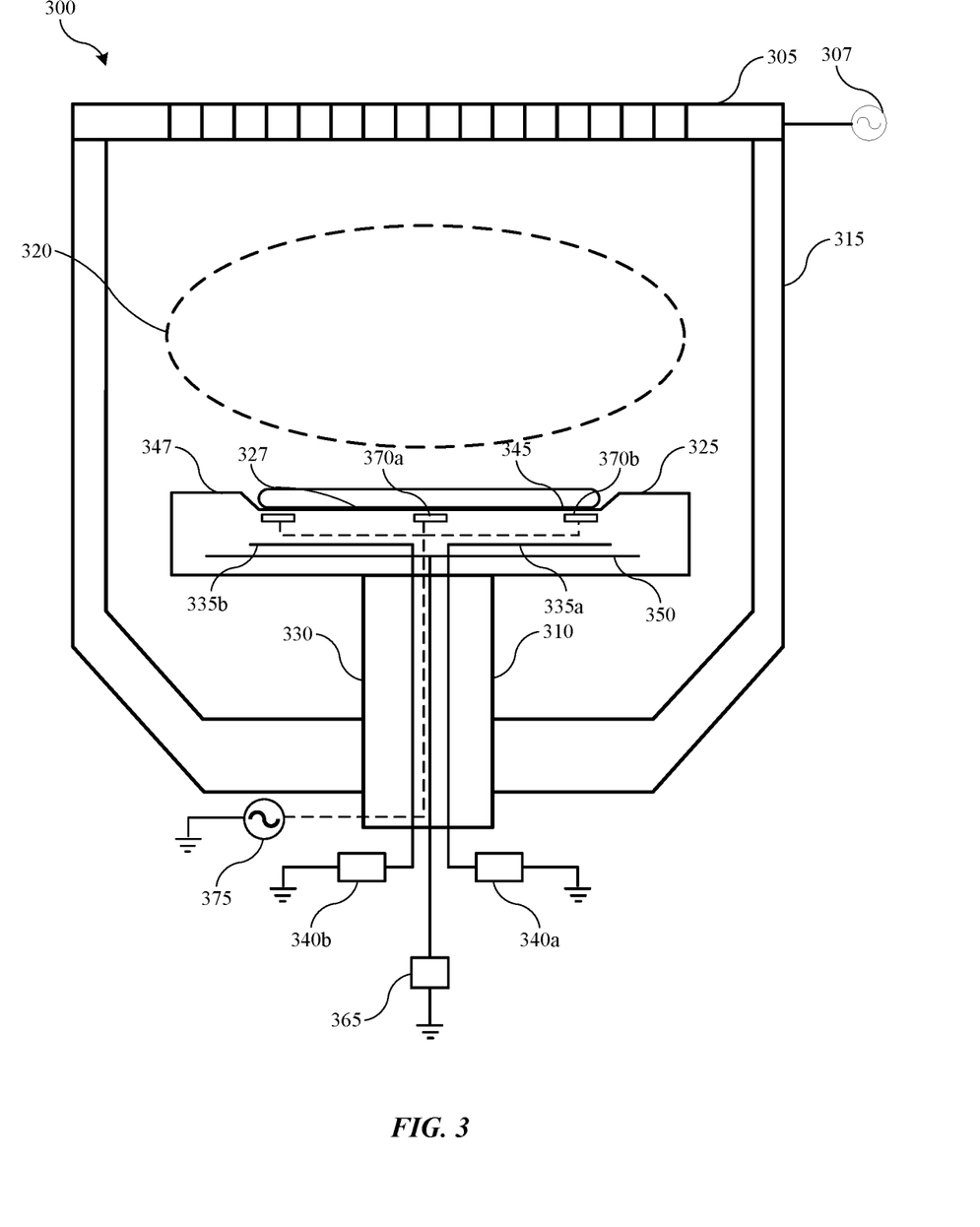
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include a first bipolar electrode 335a, which may be embedded within the chuck body proximate the substrate support surface. Electrode 335a may be electrically coupled with a DC power source 340a. Power source 340a may be configured to provide energy or voltage to the electrically conductive chuck electrode 335a. This may be operated to form a plasma of a precursor within the processing region 320 of the semiconductor processing chamber 300, although other plasma operations may similarly be sustained. For example, electrode 335a may also be a chucking mesh that operates as electrical ground for a capacitive plasma system including an RF source 307 electrically coupled with showerhead 305. For example, electrode 335a may operate as a ground path for RF power from the RF source 307, while also operating as an electric bias to the substrate to provide electrostatic clamping of the substrate to the substrate support surface. Power source 340a may include a filter, a power supply, and a number of other electrical components configured to provide a chucking voltage.

The electrostatic chuck body may also include a second bipolar electrode 335b, which may also be embedded within the chuck body proximate the substrate support surface. Electrode 335b may be electrically coupled with a DC power source 340b. Power source 340b may be configured to provide energy or voltage to the electrically conductive chuck electrode 335b. Additionally electrical components and details about bipolar chucks according to some embodiments will be described further below, and any of the designs may be implemented with processing chamber 300. For example, additional plasma related power supplies or components may be incorporated as will be explained further below.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340a and 340b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket that serves as a substrate seat in which a substrate 337 may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Electrostatic chuck body 325 include one or more capacitive sensors 370, which may be embedded within the chuck body 325 proximate the substrate support surface 327. The capacitive sensors 370 may be disposed within the chuck body 325, with a top surface of each capacitive sensor 370 being positioned below, but proximate, a top surface of the recessed region 345. For example, the capacitive sensors 370 may be disposed between the top surface of the recessed region 345 and the chucking electrodes 335 and/or heater 350. The capacitive sensors 370 may be arranged under the recessed region 345 at one or more radial positions relative to a center of the recessed region 345. As illustrated, an inner capacitive sensor 370a is disposed at a position that is proximate a center of the recessed region 345. For example, the inner capacitive sensor 370a may be disposed at a position that is inward of or about 25% of a radial distance from the center of the recessed region 345 and a peripheral edge of the recessed region 345, inward of or about 20% of the radial distance, inward of or about 15% of the radial distance, inward of or about 10% of the radial distance, inward of or about 5% of the radial distance, inward of or about 3% of the radial distance, inward of or about 1% of the radial distance, or less. The inner capacitive sensor 370a may be coaxially aligned with the recessed region 345. While shown with one inner capacitive sensor 370a, it will be appreciated that zero or multiple inner capacitive sensors 370a may be used. When multiple inner capacitive sensors 370a are used, the inner capacitive sensor 370a may be at the same or different radial and/or angular positions relative to the recessed region 345.

As illustrated, a number of outer capacitive sensors 370b may be disposed at positions that are proximate a peripheral edge of the recessed region 345. For example, the outer capacitive sensors 370b may be disposed at a position that is outward of or about 75% of a radial distance from the center of the recessed region 345 and the peripheral edge of the recessed region 345, outward of or about 80% of the radial distance, outward of or about 85% of the radial distance, outward of or about 90% of the radial distance, outward of or about 95% of the radial distance, outward of or about 97% of the radial distance, outward of or about 99% of the radial distance, or more. The outer capacitive sensors 370b may be aligned with and/or may overlap with the peripheral edge of the recessed region 345. While shown with outer capacitive sensors 370b at the same radial position, it will be appreciated that some or all of the outer capacitive sensors 370b may be disposed at different radial positions relative to the center of the recessed region 345.

While illustrated with only capacitive sensors 370 positioned proximate the center and peripheral edge of the recessed region, it will be appreciated that the placement of capacitive sensors it not so limited. For example, one or more capacitive sensors 370 may be disposed at medial radial positions, such as radial positions that are between 25% and 75% of the radial distance between the center of the recessed region 345 and the peripheral edge of the recessed region 345. The radial position of each capacitive sensor 370 may be measured from a center, innermost edge, and/or outermost edge of the respective capacitive sensor 370.

Each capacitive sensor 370 may be electrically coupled with an AC power source 375. Power source 375 may provide energy or voltage to the capacitive sensors 370. For example, power may be supplied to each capacitive sensor 370 through the stem 330. In operation, voltage is supplied to the capacitive sensors 370, which creates an electric potential on the substrate 337 that causes electrons to flow toward a positive electrode of each capacitive sensor 370 and holes to flow toward a negative electrode of each capacitive sensor 370. This allows a capacitance of the substrate 337 to be determined at each position of a capacitive sensor 370. The capacitance may be measured directly and/or may be converted from an impedance measurement. The capacitance from each capacitive sensor 370 may be used to determine whether there is a gap between the top surface of the recessed region 345 and the bottom surface of the substrate 337. For example, lower capacitance values may be associated with larger gaps formed between the top surface of the recessed region 345 and the bottom surface of the substrate 337, while high capacitance values may be associated with smaller and/or no gaps. The capacitive sensors 370 may generate a specific voltage that corresponds to certain changes in capacitance. The voltage may be scaled to represent a change in distance. For example, a particular voltage may be associated with a given change in distance. As just one example, a capacitive sensor 370 may have a change in distance that is determined by 1V/100 µm such that each 1 volt change in voltage sensed is representative of a distance of 100 µm in a given direction (based on a polarity of the voltage measurement) between the substrate 337 and a reference point (such as the capacitive sensor 370, the recessed region 345, and/or other reference point). It will be appreciated that other voltage/distance ratios may be utilized. Some embodiments may correlate a given capacitance value and/or change in capacitance value with a given distance in a similar manner as voltage.

The determination of whether there are any gaps between the substrate 337 and the recessed region 345 may be performed in a number of manners. For example, the capacitance value of each capacitive sensor 370 may be compared to a baseline value. The baseline value may be a known capacitance value associated with the substrate 337 being in direct contact with top surface of the recessed region 345. When the measured capacitive values match (or substantially match) the baseline value, it may be determined that a portion of the substrate 337 directly above a given capacitive sensor 370 is in contact with the recessed region 345. As used herein, substantially match may mean within or about 10% of the baseline (or other) value, within or about 5% of the baseline value, within or about 3% of the baseline value, within or about 1% of the baseline value, or less. Capacitance values may be considered to substantially match when values are within a margin of error of the capacitive sensor 370. If the measured capacitive value of a given capacitive sensor 370 is less than the baseline value (or less than a threshold limit), it may be determined that a gap exists between the substrate 337 and the recessed region 345. The threshold limit may be any deviation from the baseline (or other) value that exceeds or is about 10% of the baseline value, exceeds or is about 5% of the baseline value, exceeds or is about 3% of the baseline value, or exceeds or is about 1% of the baseline value. The threshold limit may be based on a margin of error of the capacitive sensor 370.

In some embodiments, the determination of whether there are any gaps between the substrate 337 and the top surface of recessed region 345 may be performed by comparing the capacitance of each capacitive sensor 370 to the capacitance of at least one capacitive sensor 370. For example, if multiple capacitance values are approximately the same, it may be determined that portions of the substrate 337 are at a same distance (which may be zero if the substrate 337 is in contact with the recessed region 345) from the top surface of recessed region 345 at each of the capacitive sensors 370 that have the same approximate capacitance value. As used herein, the term "approximately" may mean within or about 10%, within or about 5%, within or about 3%, within or about 1%, or less. Capacitance values that are different from one another may mean that the portions of the substrate 337 in alignment with the capacitive sensors 370 having smaller capacitance measurements have gaps (or larger gaps) while portions of the substrate 337 in alignment with the capacitive sensors 370 having larger capacitance measurements have no gap (or smaller gaps). The capacitive sensor measurements may be compared to all other capacitive sensor measurements and/or just measurements from a subset of the capacitive sensors 370. For example, measurements from outer capacitive sensors 370b may be compared to measurements from only other outer capacitive sensors 370b, while measurements from inner capacitive sensors 370a may be compared with measurements from other inner capacitive sensors 370a. Measurements from inner and outer capacitive sensors may be compared to one another, which may provide an indication of whether the substrate 337 is bowed. For example, if capacitive measurements from inner or outer capacitive sensors indicate that the substrate 337 is in contact with the recessed region 345 while capacitive measurements from the other subset of capacitive sensors indicate a gap is present, it may be determined that the substrate 337 is bowed.

The determination of whether there are any gaps between the substrate 337 and the recessed region 345 may be performed by determining an average capacitance of all or a subset of the capacitive sensors 370, which may serve as a baseline capacitance measurement. The measurement from each individual capacitive sensor 370 may then be compared to the average capacitance. The difference of each measured capacitance and the average capacitance may be used to identify areas of small, large, and/or no gaps between the substrate 337 and the recessed region 345. It will be appreciated that other techniques may be used to determine whether there are any gaps between the substrate 337 and the recessed region 345, which may include combinations of one or more of the techniques described above.

The determination of whether there are any gaps between the substrate 337 and the recessed region 345 may be performed may be performed in situ, which may enable a chucking force to be adjusted and/or other action to be taken based on whether there are any gaps between the substrate 337 and the recessed region 345. For example, when one or more gaps are detected, a chucking force may be increased to eliminate the gaps and fully clamp the substrate 337 against the recessed region 345, which may eliminate any bowing present. In some embodiments, increasing the chucking force may involve increasing a chucking voltage supplied to the chucking electrodes 335. After one or all substrate processing operations are completed, application of the chucking force may be halted such that the substrate 337 may be lifted and/or otherwise moved. In some instances, residual electrostatic charges will remain and continue to clamp down all or a part of the substrate 337. By detecting whether any gaps are present, it may be determined whether any residual chucking forces remain, which may enable mitigating actions to be taken to discharge residual static forces prior to attempting to move the substrate using lift pins or other mechanisms, as attempting to move the clamped substrate 337 may result in damage to the substrate 337. While discussed primarily in relation to bi-polar electrostatic chucking, it will be appreciated that the technology of the present invention is not so limited, and that the capacitive sensing techniques described herein may be used in conjunction with other chucking mechanisms, such as monopolar electrostatic chucks and/or vacuum chucks.

Figure 4:
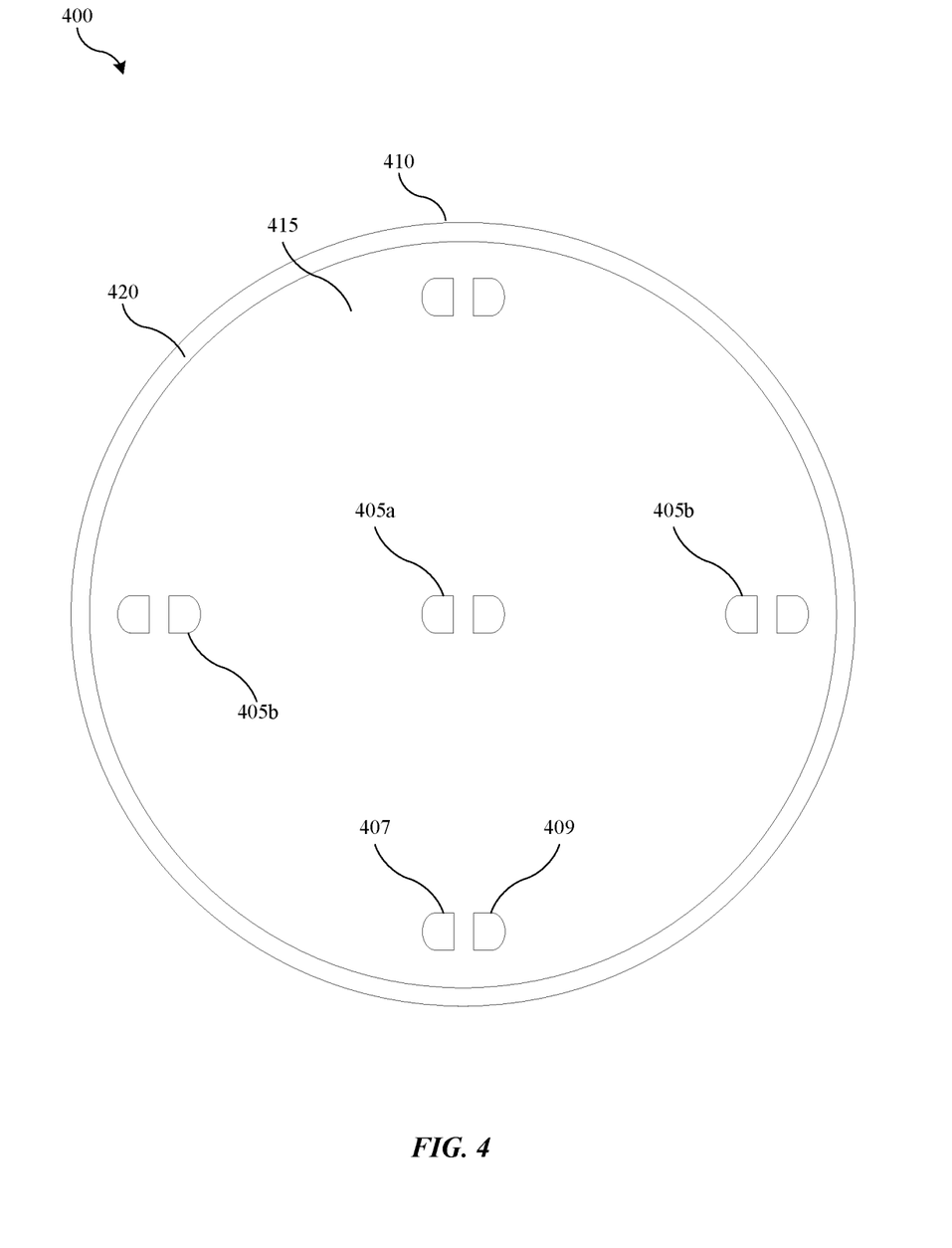
FIG. 4 shows a schematic top view of a capacitive sensor arrangement for an exemplary substrate support assembly according to some embodiments of the present technology.

FIG. 4 shows a schematic top view of a capacitive sensor arrangement 400 for an exemplary substrate support assembly according to some embodiments of the present technology. The capacitive sensor arrangement 400 may include a number of capacitive sensors 405 that are disposed within a chuck body 410, which may be similar to chuck body 325 described above. For example, the chuck body 410 may include a substrate seat 415 that is surrounded by an external region 420. The substrate seat 415 may be similar to recessed region 345, with the external region 420 protruding above a top surface of the substrate seat 415. The capacitive sensors 405 may be similar to capacitive sensors 370 previously described in relation with substrate support assembly 310, or any other number of pedestals or chucks. Each capacitive sensor 405 may include a positive electrode 407 and a negative electrode 409 which may be used to deliver an AC voltage to the substrate seat 415. As illustrated, capacitive sensor arrangement 400 may include a single inner capacitive sensor 405a that is positioned proximate a center of the substrate seat 415 and a number of outer capacitive sensors 405b that are positioned proximate a peripheral edge of the substrate seat 415.

While shown with inner capacitive sensor 405a, any number of inner capacitive sensors 405a may be included in a given embodiment. For example, the sensor arrangement 400 may include more than or about one inner capacitive sensor 405a, more than or about two inner capacitive sensors 405a, more than or about three inner capacitive sensors 405a, more than or about four inner capacitive sensors 405a, more than or about five inner capacitive sensors 405a, or more. Each inner capacitive sensor 405a may be at a same or different radial and/or angular position relative to a center of the substrate seat 415. The outer capacitive sensors 405b may be arranged with approximately a same radial distance from the center of the substrate seat 415 as shown here, or may be arranged with one or more of the outer capacitive sensors 405b being at different radial positions. While shown here with the outer capacitive sensors 405b being arranged at equal angular intervals about the substrate seat 415, it will be appreciated that one or more of the outer capacitive sensors 405b may be spaced at irregular angles. Additionally, any number of inner and/or outer capacitive sensors 405 may be provided across an area of a given substrate seat 415. For example, the number of outer capacitive sensors 405b may be more than or about two, more than or about three, may be more than or about four, more than or about five, more than or about ten, more than or about twenty, more than or about thirty, or more. Greater numbers of capacitive sensors across the substrate seat 415 may provide greater levels of detail regarding the presence and size of gaps between a substrate and the substrate seat 415.

Figure 4A:
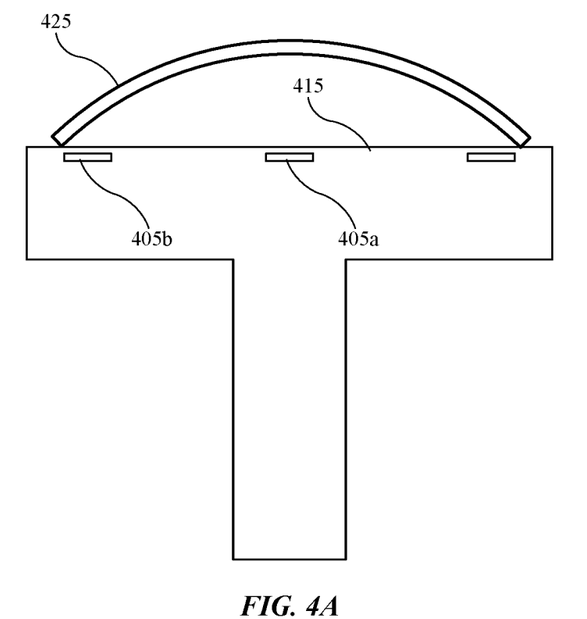
FIG. 4A shows a schematic partial cross-sectional view of the capacitive sensor arrangement of FIG. 4.
Figure 4B:
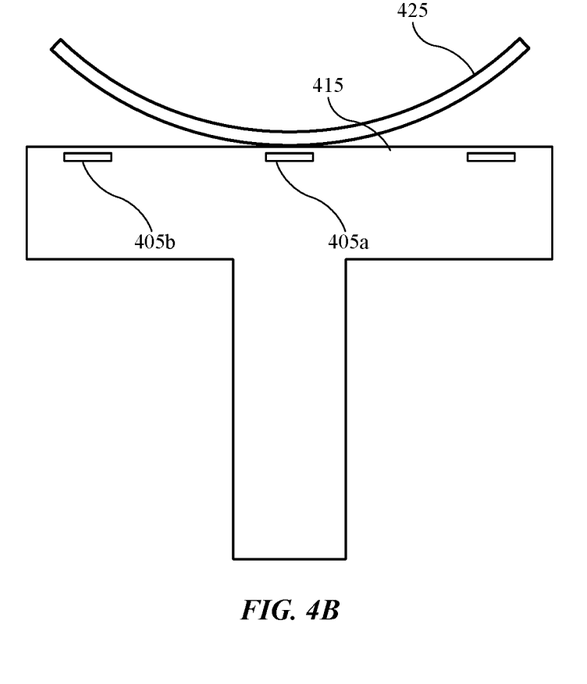
FIG. 4B shows a schematic partial cross-sectional view of the capacitive sensor arrangement of FIG. 4.

By including capacitive sensors at both inner and outer regions of the substrate seat 415, the presence of any bowing of a substrate may be determined. Additionally, a magnitude and/or type of bowing may be identifiable based on capacitive measurements from a capacitive sensor arrangement such as capacitive sensor arrangement 400. For example, if the capacitance measurement from the inner capacitive sensor 405a indicates a gap, while the capacitance measurements of the outer capacitive sensors 405b indicate contact between a substrate 425 and the substrate seat 415, it may be determined that the substrate is exhibiting compressive bowing as illustrated in FIG. 4A. If the capacitance measurement from the inner capacitive sensor 405a indicates contact between the substrate 425 and the substrate seat 415 and the capacitance measurements of the outer capacitive sensors 405b indicate the presence of a gap, it may be determined that the substrate 425 is exhibiting tensile bowing as illustrated in FIG. 4B.

Additionally, the capacitive measurements may be useable to determine a magnitude of the size of each gap at each capacitive sensor location. For example, as indicated above, the capacitance and/or voltage reading from each capacitive sensor 405 may be correlated with a given distance of the substrate 425 from the capacitive sensor 405, substrate seat 415, and/or other reference point. Based on the distances, a gap size may be determined at each capacitive sensor location where a gap has been detected. Based on the location of gaps, magnitude of gaps, and/or type of bowing, one or more processing parameters, such as chucking force, may be adjusted to reduce the gaps/bowing and/or otherwise mitigate the effects of the gaps/bowing.

Figure 5:
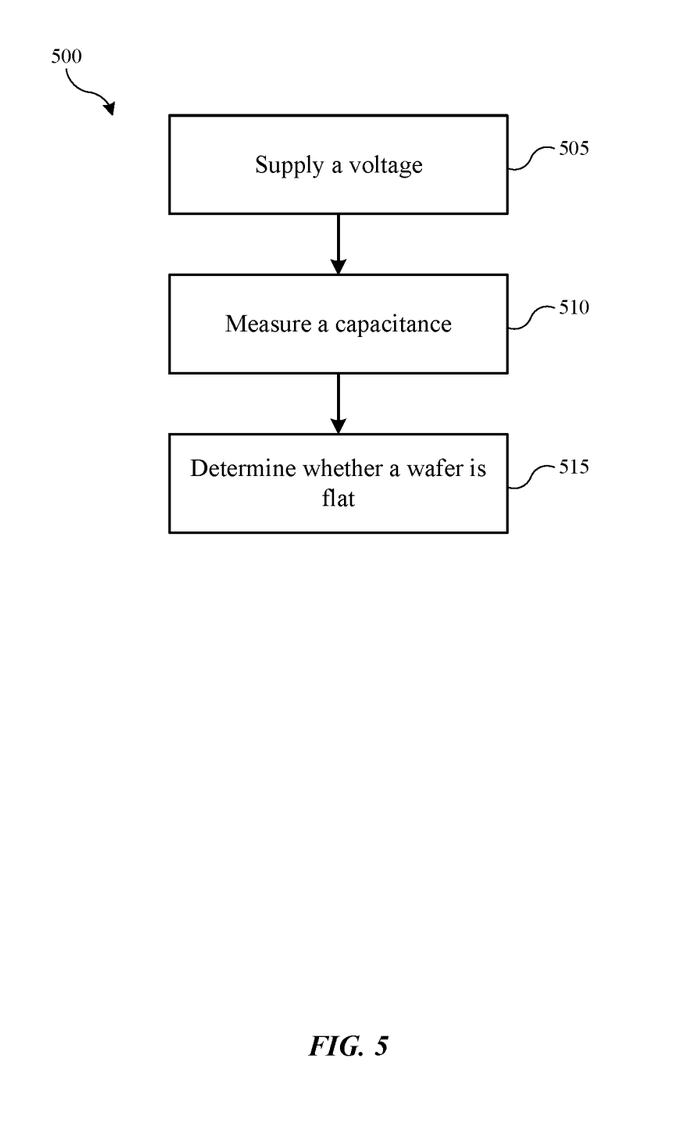
FIG. 5 is a flowchart of an exemplary method of determining whether a wafer is fully chucked according to some embodiments of the present technology.

FIG. 5 shows operations of an exemplary method 500 of determining whether a wafer is fully chucked according to some embodiments of the present technology. The method 500 may be performed in a variety of processing chambers, including processing system 200 and chamber 300 described above, and may utilize a variety of chuck bodies, including chuck bodies 325 and 410 described above. Method 500 may include a number of optional operations, which may or may not be specifically associated with some embodiments of methods according to the present technology.

Method 500 may include a processing method that may include operations for forming a hardmask film or other deposition operations. The method may include optional operations prior to initiation of method 500, or the method may include additional operations. For example, method 500 may include operations performed in different orders than illustrated. In some embodiments, method 500 may include supplying a voltage to a plurality of capacitive sensors (which may be similar to capacitive sensors 370 and 405 described above) embedded within a chuck body at operation 505. For example, the voltage may be supplied from an AC power source through a stem of the chuck body. The chuck body may be a bi-polar electrostatic chuck body, a monopolar electrostatic chuck body, and/or a vacuum chuck body. The chuck body may define a substrate support surface that defines a substrate seat. At least one of the capacitive sensors may be positioned proximate a center of the substrate seat and at least one of the capacitive sensors may be positioned proximate a peripheral edge of the substrate seat. At operation 510, a capacitance may be measured at each of the plurality of capacitive sensors.

At operation 515, a determination may be made whether a wafer positioned atop the substrate seat is positioned flat against the substrate. The determination may be made based at least in part on a capacitance measurement of each of the capacitive sensors. For example, the determination may be made by comparing each measured capacitance to a baseline value. Measured capacitances that at least substantially match the baseline may indicate no gap at a given location of the wafer, while measured capacitances that deviate from the baseline may indicate the presence of a gap. The determination at operation 515 may be made by comparing the capacitance of each capacitive sensor to the capacitance of at least one other capacitive sensor, with relatively high capacitances indicating no gap or a small gap and relatively low capacitances indicating the presence of gaps and/or the presence of a large gap. In some embodiments, the determination at operation 510 may include determining an average capacitance of the capacitive sensors and comparing the capacitance of each capacitive sensor to the average capacitance.

The method 500 may include determining a type of bowing of the wafer and/or a magnitude of bowing of the wafer based on the capacitance measurements of the capacitive sensors. For example, if the capacitance measurement from inner capacitive sensors indicates a gap while the capacitance measurements of outer capacitive sensors indicate contact between the substrate and the substrate seat, there may be compressive bowing of the wafer. Conversely, if the capacitance measurement from the inner capacitive sensors indicates contact between the substrate and the substrate seat and the capacitance measurements of the outer capacitive sensors indicate the presence of a gap, there may be tensile bowing of the wafer. Based on a measured value of each capacitive sensor, a magnitude of each gap may be calculated.

One or more adjustments to processing measures may be made based on the capacitance measurements and/or the determination of whether any gaps are present. For example, a chucking force may be adjusted based on the capacitance of each capacitive sensor. When one or more gaps are detected, a chucking force may be increased to eliminate the gaps and fully clamp the wafer against the substrate seat. Increasing the chucking force may involve increasing a chucking voltage and/or vacuum force supplied. In some instances, after completing one or more processing steps and cutting off the chucking force, residual electrostatic charges may remain and continue to clamp down all or a part of the wafer. If the capacitance of one or more of the capacitive sensors indicates that the wafer is still fully or partially chucked, one or more mitigating actions may be taken to discharge any residual static forces prior to attempting to move the substrate using lift pins or other mechanisms.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the mesh" includes reference to one or more meshes and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:
   an electrostatic chuck body defining a substrate support surface that defines a substrate seat;
   a support stem coupled with the electrostatic chuck body;
   a heater embedded within the electrostatic chuck body;
   a first bipolar electrode embedded within the electrostatic chuck body between the heater and the substrate support surface;
   a second bipolar electrode embedded within the electrostatic chuck body between the heater and the substrate support surface;
   at least one inner capacitive sensor embedded within the electrostatic chuck body at a position proximate a center of the substrate seat; and
   at least one outer capacitive sensor embedded within the electrostatic chuck body at a position proximate a peripheral edge of the substrate seat, wherein each of the at least one inner capacitive sensor and the at least one outer capacitive sensor comprises a negative electrode and a positive electrode with the negative electrode positioned adjacent to the positive electrode within the electrostatic chuck body.

2. The substrate support assembly of claim 1, wherein:
   each of the at least one inner capacitive sensor and the at least one outer capacitive sensor is disposed between a surface of the substrate seat and a top surface of one or both of the first bipolar electrode and the second bipolar electrode.

3. The substrate support assembly of claim 1, wherein:
   the at least one outer capacitive sensor comprises a plurality of outer capacitive sensors disposed about the peripheral edge of the substrate seat.

4. The substrate support assembly of claim 3, wherein:
   at least two of the plurality of outer capacitive sensors are disposed at equal radial distances from a center of the substrate seat.

5. The substrate support assembly of claim 3, wherein:
   the plurality of outer capacitive sensors are disposed at equal angular intervals about the peripheral edge of the substrate seat.

6. The substrate support assembly of claim 1, further comprising:
   an AC voltage supply coupled with each of the at least one inner capacitive sensor and the at least one outer capacitive sensor.

7. A substrate support assembly, comprising:
   a chuck body defining a substrate support surface that defines a substrate seat;
   a support stem coupled with the chuck body;
   a heater embedded within the chuck body;
   a chucking mechanism disposed within the chuck body between the heater and the substrate support surface;
   at least one inner capacitive sensor embedded within the chuck body at a position proximate a center of the substrate seat; and
   a plurality of outer capacitive sensors embedded within the chuck body at positions proximate a peripheral edge of the substrate seat, wherein each of the at least one inner capacitive sensor and the plurality of outer capacitive sensors comprises a negative electrode and a positive electrode with the negative electrode positioned adjacent to the positive electrode within the chuck body.

8. The substrate support assembly of claim 7, wherein:
   at least two of the plurality of outer capacitive sensors are spaced at equal radial distances from a center of the substrate seat.

9. The substrate support assembly of claim 7, further comprising:
   an AC voltage supply coupled with each of the at least one inner capacitive sensor and the plurality of outer capacitive sensors.

10. The substrate support assembly of claim 7, wherein:
    the plurality of outer capacitive sensors are disposed at equal angular intervals about the peripheral edge of the substrate seat.

11. The substrate support assembly of claim 7, wherein:
    each of the at least one inner capacitive sensor and the plurality of outer capacitive sensors is disposed between a surface of the substrate seat and a top surface of the heater.

12. The substrate support assembly of claim 7, wherein:
    the chucking mechanism comprises a bipolar electrostatic chuck, a monopolar electrostatic chuck, or a vacuum chuck.

13. A method of determining whether a wafer is fully chucked, comprising:
    supplying a voltage to a plurality of capacitive sensors embedded within a chuck body, wherein:
       the chuck body defines a substrate support surface that defines a substrate seat;
       at least one of the plurality of capacitive sensors is positioned proximate a center of the substrate seat; and
       at least one of the plurality of capacitive sensors is positioned proximate a peripheral edge of the substrate seat, wherein each of plurality of capacitive sensors comprises a negative electrode and a positive electrode with the negative electrode positioned adjacent to the positive electrode within the chuck body;
    measuring a capacitance between the positive electrode and the negative electrode at each of the plurality of capacitive sensors; and determining whether a wafer positioned atop the substrate seat is disposed flat against the substrate seat based at least in part on the capacitance of each of the plurality of capacitive sensors.

14. The method of determining whether a wafer is fully chucked of claim 13, wherein:
   determining whether the wafer positioned atop the substrate seat is disposed flat against the substrate seat comprises comparing each capacitance to a baseline value.

15. The method of determining whether a wafer is fully chucked of claim 14, wherein:
   determining whether the wafer positioned atop the substrate seat is disposed flat against the substrate seat comprises comparing the capacitance of each of the plurality of capacitive sensors to the capacitance of at least one other of the plurality of capacitive sensors.

16. The method of determining whether a wafer is fully chucked of claim 13, wherein:
   determining whether the wafer positioned atop the substrate seat is disposed flat against the substrate seat comprises:
   determining an average capacitance of the plurality of capacitive sensors; and
   comparing the capacitance of each of the plurality of capacitive sensors to the average capacitance.

17. The method of determining whether a wafer is fully chucked of claim 13, further comprising:
   determining one or both of a type of bowing of the wafer and a magnitude of bowing of the wafer based on the capacitance of each of the plurality of capacitive sensors.

18. The method of determining whether a wafer is fully chucked of claim 13, further comprising:
   adjusting a chucking force based on the capacitance of each of the plurality of capacitive sensors.

19. The method of determining whether a wafer is fully chucked of claim 18, wherein:
   adjusting the chucking force comprises increasing a chucking voltage to reduce a gap between the wafer and the substrate seat.

20. The method of determining whether a wafer is fully chucked of claim 13, wherein:
   the voltage to the plurality of capacitive sensors is supplied after a chucking voltage is removed; and
   determining whether a wafer positioned atop the substrate seat is disposed flat against the substrate seat comprises determining whether any residual static forces remain on the wafer before removing the wafer from the substrate support surface.

* * * * *